United States Patent [19]

Inoue

[11] 4,105,933
[45] Aug. 8, 1978

[54] VERTICAL DEFLECTION CIRCUIT
[75] Inventor: Fumio Inoue, Yokohama, Japan
[73] Assignee: Hitachi, Ltd., Japan
[21] Appl. No.: 763,665
[22] Filed: Jan. 28, 1977
[30] Foreign Application Priority Data
  Feb. 2, 1976 [JP] Japan .................................. 51-9374
[51] Int. Cl.$^2$ ........................ H01J 29/70; H01J 29/72
[52] U.S. Cl. .................................. 315/387; 315/397
[58] Field of Search .............. 315/387, 389, 370, 399, 315/396, 397, 408, 410, 496, 497

[56] References Cited
U.S. PATENT DOCUMENTS
3,868,537 2/1975 Haferl .................................. 315/389

Primary Examiner—Maynard R. Wilbur
Assistant Examiner—T. M. Blum
Attorney, Agent, or Firm—Craig & Antonelli

[57] ABSTRACT

A vertical deflection circuit comprises a first transistor, the base of which is impressed with a vertical synchronizing signal so that it is turned on during a vertical blanking period, while it is turned off during a vertical scan period, the collector of which is connected to a constant voltage supply and the emitter of which is connected to a capacitor so that the capacitor is charged to a predetermined voltage during the vertical blanking period. A second transistor has its collector connected to the junction point of the emitter of the first transistor and the capacitor, and the base thereof is connected to another constant voltage supply. Two resistors having a low resistance are inserted in series with a vertical deflection coil and the junction point of the resistors is coupled to the emitter of the second transistor through a feedback resistor. The charge stored in the capacitor during the vertical blanking period is discharged through the second transistor during the vertical scan period. Because of the feedback, the discharge current somewhat decreases at an earlier stage of the scan period as compared with at an intermediate stage and somewhat increases at a later stage, whereby a nonlinearity of the circuit between the capacitor and the deflection coil is compensated for and a vertical deflection current of a saw-tooth wave of high linearity is produced.

5 Claims, 2 Drawing Figures

VERTICAL DEFLECTION CIRCUIT

The present invention relates to a vertical deflection circuit of a television receiver or the like.

A vertical deflection circuit which improves the vertical linearity of an electromagnetically deflected cathode ray tube is disclosed in the Japanese Pat. No. 572,508 (Patent Publication 29906/69). The disclosed vertical deflection circuit includes an oscillation stage comprising a combination of a capacitor, a first transistor which functions as a constant current source to supply a constant current to the capacitor during a vertical scan period to produce a voltage having a given gradient across the capacitor, and a second transistor which functions as a switch which is turned on during a vertical blanking period and turned off during the vertical scan period to restore a charge voltage of the capacitor from the voltage level at the end of the vertical scan period to the voltage level at the start of the vertical scan period. The disclosed vertical deflection circuit also includes a vertical deflection coil, an amplifier stage for amplifying the voltage across the capacitor to drive the vertical deflection coil, and a feedback circuit for differentiating an output voltage appearing across the vertical deflection coil and feeding the differentiated voltage back to the transistor forming the current source for improving the linearity of the vertical deflection coil. In the vertical deflection circuit described above, since the output voltage appearing across the vertical deflection coil is fed back to the current source, the linearity of the vertical deflection current waveform would be well assured, provided that a given output current waveform, that is, the vertical deflection current waveform is produced for a given output voltage waveform. However, since both the resistance and the inductance of the vertical deflection coil considerably vary with the temperature, and hence the impedance of the vertical deflection coil will vary with the temperature, the linearity of the vertical deflection current may not always be assured by feeding the output voltage waveform back to the current source to compensate for the non-linearity of the output voltage waveform.

It is an object of the present invention to provide a vertical deflection circuit which provides a stabilized compensation for the non-linearity of the vertical deflection current waveform and is not affected by temperature changes.

The vertical deflection circuit of the present invention comprises a vertical oscillator stage including a capacitor across which a saw-tooth wave voltage is generated, a current source for charging or discharging the capacitor at a substantially constant rate during a vertical scan period, and means for discharging or charging the capacitor during a vertical blanking period to restore the charge voltage of the capacitor from a voltage level corresponding to the end of the vertical scan period to a voltage level corresponding to the start of the vertical scan period, a vertical deflection coil, an amplifier stage connected between the vertical oscillator stage and the vertical deflection coil, and a feedback circuit for compensating the charging or discharging current during the vertical scan period for a non-linearity of a circuit between the capacitor and the vertical deflection coil, said feedback circuit detecting a vertical deflection current waveform and generating an analogous voltage by which the current source is controlled.

The present invention will now be described in detail with reference to the accompanying drawings, in which.

Figure 1:
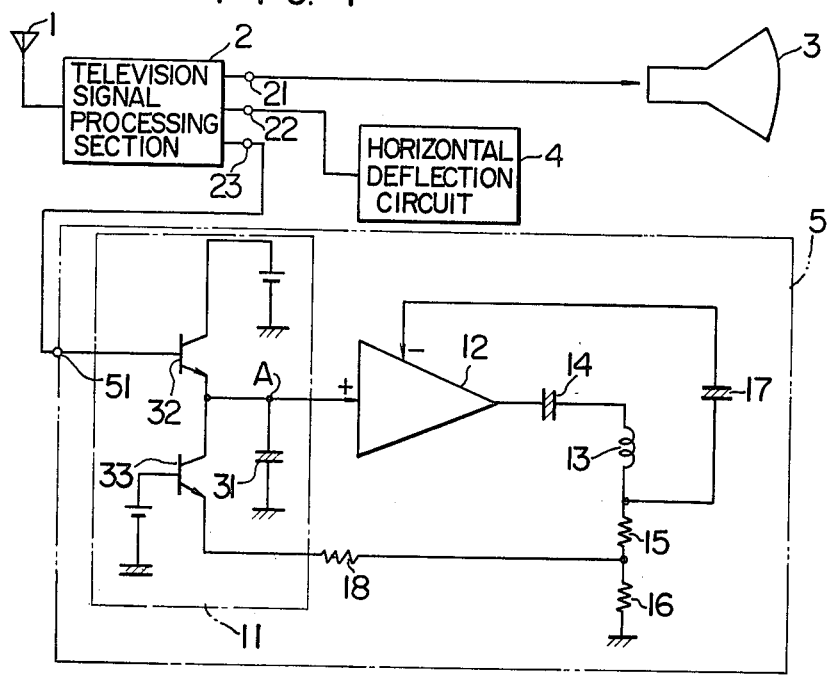
FIG. 1 is a circuit diagram for illustrating one embodiment of the present invention.

Referring now to FIG. 1, a television signal received by an antenna 1 is processed in a television signal processing section 2 which produces a video signal, a horizontal synchronizing signal and a vertical synchronizing signal at output terminals 21, 22 and 23. The video signal is used to intensity modulate an electron beam of a cathode ray tube 3. A horizontal deflection circuit 4 controls the horizontal deflection of the electron beam and a vertical deflection circuit 5 controls the vertical deflection of the electron beam.

An oscillator stage 11 responds to the vertical synchronizing signal supplied to a terminal 51 to produce a saw-tooth wave voltage of a vertical cycle, which is then applied to an amplifier 12. The amplifier 12 amplifies the saw-tooth wave voltage to feed a requisite amplitude of saw-tooth wave current to a vertical deflection coil 13. A capacitor 14 serves to eliminate a D.C. component from the vertical deflection current, and resistors 15 and 16 have a low resistance to insure that a voltage waveform which is analogous to the vertical deflection current waveform is produced thereacross. A capacitor 17 serves to transfer the negative feedback of the saw-tooth voltage waveform back to the amplifier 12 and a resistor 18 serves to feed the saw-tooth voltage waveform which is analogous to the vertical deflection current waveform back to the oscillator stage 11. During the vertical scan period, a saw-tooth wave current which decreases with time flows through the vertical deflection coil 13.

The negative feedback through the capacitor 17 serves to stabilize the vertical deflection current while the feedback through the resistor 18 serves to compensate for a non-linear distortion inherent in the operation of the amplifier 12 or a non-linear distortion introduced by the negative feedback. In FIG. 1, a positive feedback circuit for maintaining the oscillation of the vertical cycle in the absence of the vertical synchronizing signal is omitted.

The capacitor 31 is charged during the vertical blanking period through a transistor 32 which is turned on during that period and turned off during the vertical scan period, and it is discharged during the vertical scan period through a transistor 33. Assuming that one end of the resistor 18 having its other end connected to the emitter of the transistor 33 is grounded instead of being connected to the junction point of the resistors 15 and 16, the collector current of the transistor 33 would be constant and hence the discharge current of the capacitor 31 would be constant. As a result, the voltage across the capacitor 31 would decrease linearly resulting in a highly linear saw-tooth wave voltage at a node A. The transistor 33 would thus operate as a current source which draws a constant discharge current from the capacitor 31.

Actually, however, a ripple voltage of the vertical cycle appears across the feedback capacitor 17, which deteriorates the linearity of the saw-tooth wave. Theoretically, the ripple voltage can be suppressed if the capacitance of the capacitor 17 is infinite, however, in actual pratice this is impossible. Furthermore, too large a capacitance of the capacitor 17 results in the drawback that the swinging time of the picture becomes longer at the transient period of time when a channel is changed or brightness is adjusted. If a resistor is used instead of the feedback capacitor 17 to provide a direct coupling, the resistance thereof must be large. Since the resistances of the resistors 15 and 16 connected in series with the vertical deflection coil 13 are chosen to be in the order of several ohms in order to prevent the influence on the vertical deflection current, the amplitude of the saw-tooth wave voltage developed across the resistors 15 and 16 is small. Accordingly, a sufficient amount of feedback is not obtained even if a high resistance is used instead of the capacitor 17. Therefore, it is difficult to avoid the deterioration of the linearity of the saw-tooth wave by the negative feedback.

The feedback through the capacitor 17 causes a downwardly convex distortion in the saw-tooth wave which generally linearly decreases during the vertical scan period. Furthermore, the amplifier 12 itself causes a downwardly convex distortion in the generally linearly decreasing saw-tooth wave due to the non-linearity inherent in the transistors and the capacitor.

The feedback of the saw-tooth wave voltage which decreases with time to the emitter of the transistor 33 causes the collector current of the transistor 33 to increase with time such that a distortion of opposite polarity to that of the above distortion is imparted to the saw-tooth wave developed at the node A. In this manner, the above distortion is compensated as a whole.

According to the present invention, a voltage waveform which is analogous to the vertical deflection current is produced at the junction point of the resistors 15 and 16 to insure the linearity of the voltage waveform. As a result, the linearity of the vertical deflection current waveform is assured in spite of the variation in the impedance of the vertical deflection coil 17 due to a change in the temperature. On the other hand, in the prior art circuit described above, since it is arranged to compensate for the non-linearity of the voltage waveform supplied to the vertical deflection coil, the vertical deflection current will change if the impedance of the vertical deflection coil changes even though the non-linearity of the voltage across the vertical deflection coil is compensated for. As a result, the non-linearity of the vertical deflection current would not be compensated for. The present invention, on the other hand, compensates for the non-linearity of the vertical deflection current waveform in a stable manner.

Furthermore, since an oscillation waveform of the oscillator stage comprising the current source such as the transistor 33 is more stable to the variation in the magnitude of components than an oscillation waveform of an oscillator stage including a time constant circuit comprising a resistor and a capacitor, means for adjusting the amount of feedback, which includes a potentiometer as the resistor 18 may be eliminated.

It should be understood that when the distortion in the linearity of the vertical deflection current waveform affected by the circuit of the capacitor 31 to the vertical deflection coil 13 is of opposite polarity to that described above, the waveform fed back to the transistor 33 need only be inverted.

Figure 2:
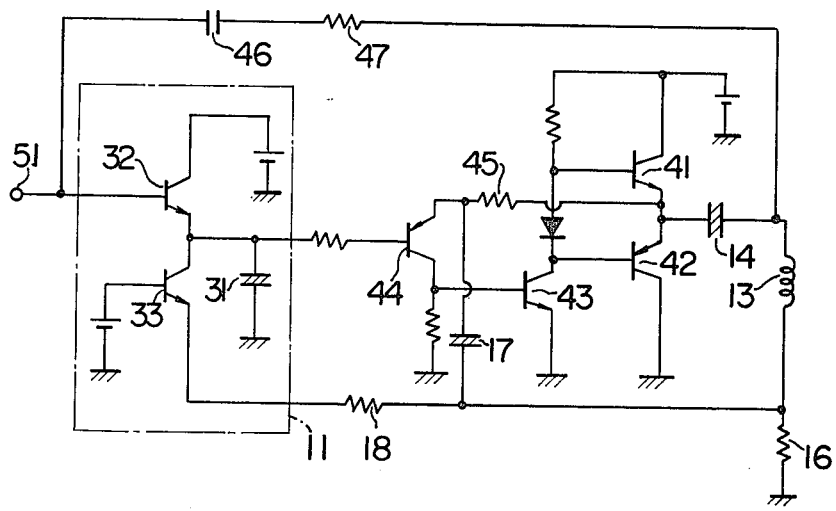
FIG. 2 is a specific circuit diagram for illustrating another embodiment of the present invention.

FIG. 2 shows a specific circuit diagram illustrating another embodiment of the vertical deflection circuit of the present invention.

Output transistors 41 and 42 are driven by a driving transistor 43 so that the transistors 41 and 42 conduct during the first half and the second half, respectively, of the vertical scan period. In order to stabilize the amplification factor, a saw-tooth wave voltage appearing at a junction point of the resistor 16 and the vertical deflection coil 13 is fed back to a predriving transistor 44 in a negative phase through the capacitor 17. Also fed back in a negative phase to the predriving transistor through a resistor 45 is the output voltage supplied to the vertical deflection coil 13. A capacitor 46 and a resistor 47 provide positive feedback to maintain the vertical oscillation even in the absence of a vertical synchronizing signal.

What is claimed is:

1. A vertical deflection circuit comprising:
   a capacitor across which a saw-tooth wave voltage is to be generated;
   a current source connected to said capacitor for supplying a substantially constant current to said capacitor during a vertical scan period to produce a linearly increasing or decreasing charge voltage across said capacitor;
   capacitor charge voltage control means including a switch which is controlled by a vertical synchronizing signal to be turned on during a vertical blanking period and turned off during the vertical scan period, said capacitor charge voltage control means supplying a current to said capacitor during the vertical blanking period to restore the charge voltage of said capacitor from a voltage level corresponding to the end of the vertical scan period to a voltage level corresponding to the start of the vertical scan period;
   a vertical deflection coil;
   means for amplifying the saw-tooth wave voltage developed across said capacitor to feed a saw-tooth wave current to said vertical deflection coil; and
   feedback circuit means connected between said vertical deflection coil and said current source for controlling the current supplied to said capacitor from said current source; said feedback circuit means including detection means coupled to said vertical deflection coil to produce a voltage waveform which is analogous to the saw-tooth wave current and supply means for supplying the voltage produced in said detection means to said current source thereby to control the current magnitude thereof for compensating for non-linearity of said saw-tooth wave current.

2. A vertical deflection circuit according to claim 1 wherein said detection means comprises a low impedance element connected in series with said vertical deflection coil.

3. A vertical deflection circuit according to claim 1 wherein said capacitor charge voltage control means comprises said switch and a power supply connected in series with said switch, whereby said capacitor is charged by said power supply when said switch is turned on during said vertical blanking period.

4. A vertical deflection circuit comprising:
   a capacitor;
   current source means for supplying a current to said capacitor during a vertical scan period to produce a linearly increasing or decreasing voltage across said capacitor;
   capacitor charge voltage control means including a switch which is controlled by a vertical synchronizing signal to be turned on during a vertical blanking period and turned off during the vertical scan period, said capacitor charge voltage control means supplying a current to said capacitor during the vertical blanking period to restore the voltage across said capacitor from a voltage level corresponding to the end of the vertical scan period to a voltage level corresponding to the start of the vertical scan period, so that a saw-tooth wave voltage is generated across said capacitor;

a vertical deflection coil connected to receive a saw-tooth wave current corresponding to the saw-tooth wave voltage generated across said capacitor; and feedback circuit means connected between said vertical deflection coil and said current source for controlling the current supplied to said capacitor from said current source, said feedback circuit means including detection means coupled to said vertical deflection coil to produce a voltage waveform which is analogous to the saw-tooth wave current and supply means for supplying the voltage waveform produced in said detection means to said current source so that the current supplied to said capacitor by said current source gradually increases in the vertical scan period thereby compensating for non-linearity of said saw-tooth wave current.

5. A vertical deflection circuit according to claim 4, further comprising means for amplifying the saw-tooth wave voltage generated across said capacitor and feeding the saw-tooth wave current correponding to the amplified saw-tooth wave voltage to said vertical deflection coil.

* * * * *